United States Patent [19]

Williamson

[11] Patent Number: 5,537,260

[45] Date of Patent: Jul. 16, 1996

[54] CATADIOPTRIC OPTICAL REDUCTION SYSTEM WITH HIGH NUMERICAL APERTURE

[75] Inventor: David M. Williamson, West Malvern, England

[73] Assignee: SVG Lithography Systems, Inc., Wilton, Conn.

[21] Appl. No.: 134,505

[22] Filed: Oct. 8, 1993

Related U.S. Application Data

[63] Continuation-in-part of Ser. No. 9,284, Jan. 26, 1993.

[51] Int. Cl.$^6$ ................................................. G02B 17/00
[52] U.S. Cl. ........................................... 359/727; 359/631
[58] Field of Search ................................... 359/727, 728, 359/729, 730, 732, 631, 633, 639, 663

[56] References Cited

U.S. PATENT DOCUMENTS

| | | | |
|---|---|---|---|
| 3,917,399 | 11/1975 | Buzawa et al. | 355/43 |
| 4,896,952 | 1/1990 | Rosenbluth | 359/638 |
| 4,953,960 | 9/1990 | Williamson | 359/663 |
| 5,089,913 | 2/1992 | Singh et al. | 359/727 |
| 5,212,593 | 5/1993 | Williamson et al. | 359/728 |
| 5,220,454 | 6/1993 | Ichihara et al. | 359/727 |

FOREIGN PATENT DOCUMENTS

| | | |
|---|---|---|
| 4110296A1 | 10/1991 | Germany . |
| 4203464 | 8/1992 | Germany . |
| 5088087 | 4/1993 | Japan . |

*Primary Examiner*—Georgia Y. Epps
*Assistant Examiner*—Dawn-Marie Bey
*Attorney, Agent, or Firm*—Fattibene and Fattibene; Paul A. Fattibene; Robert Moll

[57] ABSTRACT

A catadioptric optical reduction system for use in the photolithographic manufacture of semiconductors having a concave mirror operating near unit magnification, or close to a concentric condition. A lens group before the mirror provides only enough power to image the entrance pupil at infinity to the aperture stop at or near the concave mirror. A lens group after the mirror provides a larger proportion of reduction from object to image size, as well as projecting the aperture stop to an infinite exit pupil. An aspheric concave mirror is used to further reduce high order aberrations. The catadioptric optical reduction system provides a relatively high numerical aperture of 0.7 capable of patterning features smaller than 0.35 microns over a 26×5 millimeter field. The optical reduction system is thereby well adapted to a step and scan microlithographic exposure tool as used in semiconductor manufacturing. Several other embodiments combine glasses of different refracting power to widen the spectral bandwidth which can be achieved.

31 Claims, 5 Drawing Sheets

CATADIOPTRIC OPTICAL REDUCTION SYSTEM WITH HIGH NUMERICAL APERTURE

This application is a continuation-in-part, of application Ser. No. 08/009,284, filed Jan. 26, 1993.

BACKGROUND OF THE INVENTION

FIELD OF THE INVENTION

This invention relates generally to optical systems used in semiconductor manufacturing, and more particularly to an unobscured catadioptric optical reduction system having a relatively high numerical aperture.

DESCRIPTION OF THE RELATED ART

Semiconductors are usually manufactured using various photolithographic techniques. The circuitry used in a semiconductor is reproduced from a reticle onto a semiconductor chip. This reproduction is often accomplished with the use of optical systems. The design of these optical systems is often complex, and it is difficult to obtain the desired resolution necessary for reproducing the ever-decreasing size of components being placed on a semiconductor chip. Therefore, there has been much effort expended to develop an optical reduction system capable of reproducing very fine component features, less than 0.35 microns. In addition to the need to develop an optical system capable of reproducing very fine component features, there is also the need to augment system performance by increasing numerical aperture. Increasing numerical aperture provides for a higher resolution optical system.

An optical system similar to that of the present invention is disclosed in U.S. Pat. No. 4,953,960 entitled "Optical Reduction System" issuing Sep. 4, 1990 to Williamson, which is herein incorporated by reference. Therein disclosed is an optical reduction system operating in the range of 248 nanometers and having a numerical aperture of 0.45. Another similar optical system is disclosed in U.S. Pat. No. 5,089,913 entitled "High Resolution Reduction Catadioptric Relay Lens" issuing Feb. 18, 1992 to Singh et al, which is herein incorporated by reference. Therein disclosed is an optical system having a restricted spectral waveband at 248 nanometers, and having a numerical aperture of 0.6.

While these prior optical systems perform adequately for their intended purpose, there is an ever increasing need to improve system performance by increasing numerical aperture. Therefore, there is a need for an optical system having a relatively high numerical aperture capable of acceptable system performance over a relatively large spectral waveband.

SUMMARY OF THE INVENTION

The present invention comprises a catadioptric reduction system having, from the object or long conjugate end to the reduced image or short conjugate end, a first lens group, a second lens group, a beamsplitter cube, a substantially or nearly concentric concave mirror, and a third lens group. The concave mirror operates substantially near unit magnification. This reduces the aberrations introduced by the mirror and the diameter of radiation entering the beamsplitter cube. The first and second lens groups before the concave mirror provide only enough power to image the entrance pupil at infinity at the aperture stop at or near the concave mirror. The third lens group after the concave mirror provides a substantial portion of the reduction from object to image of the optical system, as well as projecting the aperture stop to an infinite exit pupil. High-order aberrations are reduced by using an aspheric concave mirror.

Accordingly, it is an object of the present invention to provide an optical system having a relatively high numerical aperture.

It is another object of the present invention to provide an optical system having a spectral bandwidth substantially wider than could have previously been obtained at such a high numerical aperture.

It is an advantage of the present invention that the concave mirror operates substantially closer to unit magnification.

It is a feature of the present invention that the lens groups before the concave mirror provide only enough power to image the entrance pupil at infinity at the aperture stop at or near the concave mirror.

It is yet another feature of the present invention that the lens group after the concave mirror provides most of the reduction from object to image of the system.

These and other objects, advantages, and features will become readily apparent in view of the following detailed description.

DESCRIPTION OF THE PREFERRED EMBODIMENTS

Figure 1:
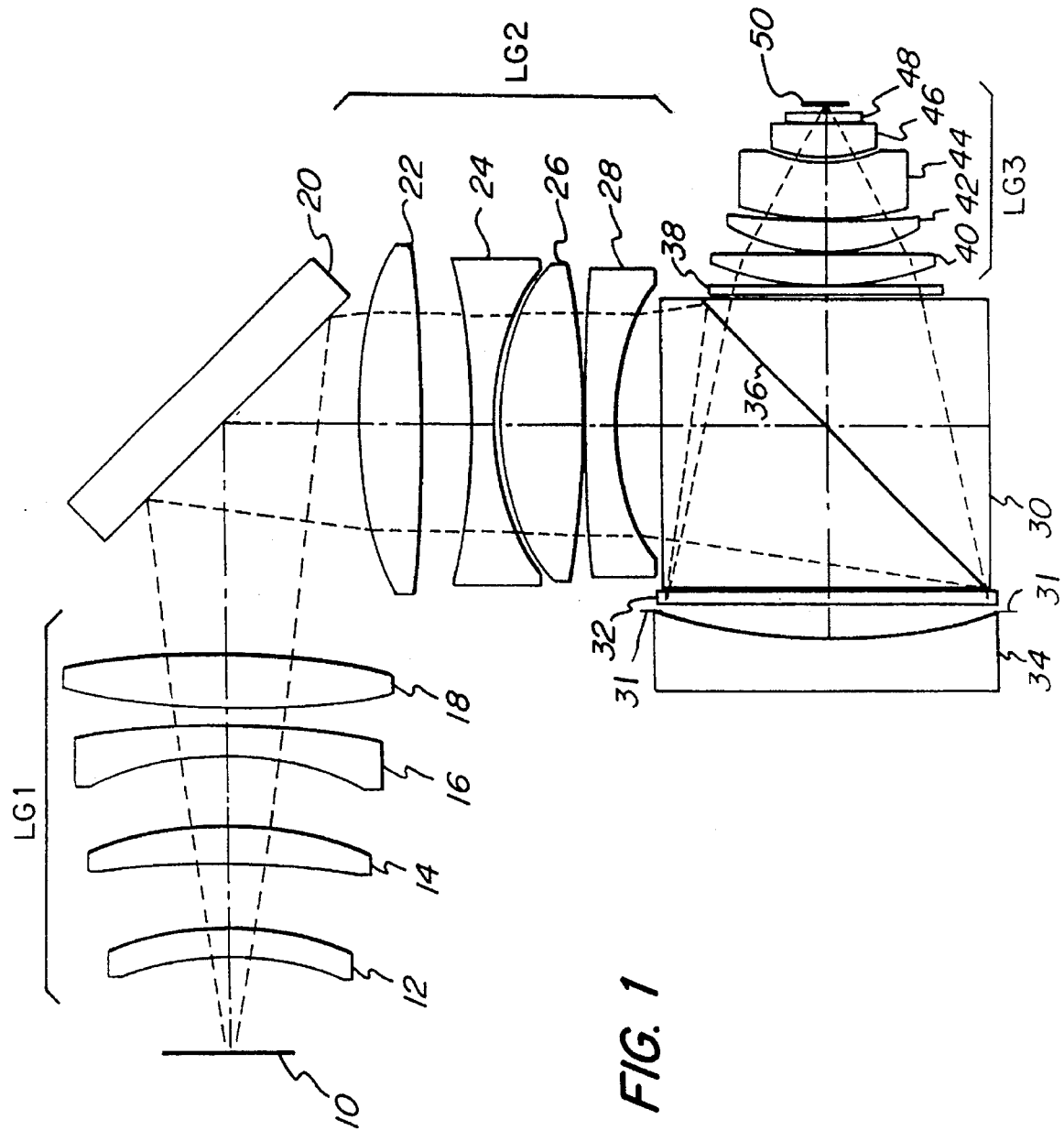
FIG. 1 is a schematic illustration of one embodiment of the present invention using a single refracting material.

FIG. 1 illustrates one embodiment of the optical reduction system of the present invention. From its long conjugant end, it comprises an object or reticle plane 10, a first lens group LG1, a folding mirror 20, a second lens group LG2, a beamsplitter cube 30, a first quarter-waveplate 32, a concave mirror 34, a second quarter-waveplate 38, and a third lens group LG3. The image is formed at image or wafer plane 50. The first lens group LG1 comprises a shell 12, a spaced doublet including positive lens 14 and negative lens 16, and positive lens 18. The shell 12 is an almost zero power lens. The second lens group LG2 comprises a positive lens 22, a spaced doublet including a negative lens 24 and a positive lens 26, and negative lens 28. The third lens group LG3 comprises two positive lenses 40 and 42, which are strongly positive, shell 44, and two positive lenses 46 and 48, which are weakly positive. The folding mirror 20 is not essential to the operation of the present invention. However, the folding mirror permits the object and image planes to be parallel which is convenient for the intended application of the optical system of the present invention, which is the manufacture of semiconductor devices using photolithography with a step and scan system.

Radiation enters the system at the reticle or long conjugate end and passes through the first lens group LG1, is reflected by the folding mirror 20, and passes through the second lens group LG2. The radiation enters the beamsplitter cube 30 and is reflected from surface 36 passing through quarter-waveplate 32 and reflected by concave mirror 34. The radiation then passes back through the quarter-waveplate 32, the beamsplitter cube 30, the quarter-waveplate 38, lens group LG3, and is focused at the image or wafer plane 50.

The lens groups before the mirror, LG1 and LG2, provide only enough power to image the entrance pupil at infinity to the aperture stop 31 at or near the concave mirror 34. The combined power of lens groups LG1 and LG2 is slightly negative. The shell 12 and air spaced doublet 14 and 16 assist in aberration corrections including astigmatism, field curvature, and distortion. The lens group LG3, after the concave mirror 34, provides most of the reduction from object to image size, as well as projecting the aperture stop to an infinite exit pupil. The two strongly positive lenses 40 and 42 provide a high numerical aperture at the image and exit pupils and infinity. The shell 44 has almost no power. The two weakly positive lenses 46 and 48 help correct high order aberrations. The concave mirror 34 may provide a reduction ratio of between 1.6 and 2.7 times that of the total system.

The negative lens 24 in the second lens group LG2 provides a strongly diverging beam directed at the beamsplitter cube 30 and concave mirror 34. The strongly positive lens 22 provides lateral color correction. The air space doublet comprising lenses 24 and 26 helps to correct spherical aberrations and coma. Concave mirror 34 is preferably aspheric, therefore helping further reduce high order aberrations.

The transmission losses introduced by the beamsplitter cube 30 are minimized by illuminating the object or reticle with plane polarized light and including a true quarter-waveplate 32 between the beamsplitter cube 30 and the concave mirror 34. By true quarter-waveplate is meant a thickness of birefringent material which introduces a quarter of a wave phase retardance between the S and P polarization states. This is in contrast to an integral number of half plus quarter waves or two thicknesses of material whose phase retardance differs by a quarter wave. The deleterious effects of large angle of incidence variations are thereby minimized at the high numerical aperture by the use of such true zero order waveplates, and by restricting the field size in the plane of incidence. Additionally, by increasing the numerical aperture in lens group LG3, after the concave mirror 34 and beamsplitter cube 30, the greatest angular range is not seen in these elements.

However, the use of plane polarized light at numerical apertures greater than about 0.5 introduces small but noticeable asymmetries in the imaging. In the present invention, this can effectively be removed by introducing a second quarter-waveplate 38 after the final passage through the beamsplitter cube 30, thereby converting the plane polarized light into circularly polarized light. This circularly polarized light is indistinguishable from unpolarized light in its imaging behavior.

The optical system illustrated in FIG. 1 is designed to operate at a reduction ratio of 4 to 1. Therefore, the numerical aperture in the image space is reduced from 0.7 by a factor of 4 to 0.175 at the object or reticle. In other words, the object space numerical aperture is 0.175 and the image space numerical aperture is 0.7. Upon leaving the first lens group LG1 the numerical aperture is reduced to 0.12, a consequence of the positive power needed in lens group LG1 to image the entrance pupil at infinity to the aperture stop of the system close to the concave mirror 34. The numerical aperture after leaving the second lens group LG2 and entering the beamsplitter is 0.19. Therefore, the emerging numerical aperture from the second lens group LG2, which is 0.19, is larger than the entering or object space numerical aperture of lens group LG1, which is 0.175. In other words, the second lens group LG2 has an emerging numerical aperture greater than the entering numerical aperture of the first lens group LG1. This is very similar to the object space numerical aperture, which is 0.175, due to the overall negative power of the second lens group LG2. This is contrary to prior art systems where the numerical aperture entering a beamsplitter cube is typically close to zero or almost collimated. The concave mirror 34 being almost concentric, the numerical aperture of the radiation reflected from it is increased only slightly from 0.19 to 0.35. The third lens group LG3 effectively doubles the numerical aperture to its final value of 0.7 at the wafer or image plane 50.

The present invention achieves its relatively high numerical aperture without obstruction by the edges of the beamsplitter cube by means of the negative second group LG2 and the strongly positive third lens group LG3. The use of the beamsplitter cube 30 rather than a plate beamsplitter is important in the present invention because at numerical apertures greater than about 0.45 a beamsplitter cube will provide better performance. There is a reduction of the numerical aperture within the cube by the refractive index of the glass, as well as the absence of aberrations that would be introduced by a tilted plate beamsplitter in the non-collimated beam entering the beamsplitter. The construction data for the lens system illustrated in FIG. 1 according to the present invention is given in Table 1 below.

TABLE 1

| Element Number | Radius of Curvature (mm) | | Thickness (mm) | Aperture Diameter (mm) | | Glass |
|---|---|---|---|---|---|---|
| | Front | Back | | Front | Back | |
| 10 | Infinite | | 63.3853 | | | |
| 12 | −158.7745 | −177.8880 | 15.0000 | 124.0478 | 131.7725 | Silica |
| Space | | | 36.1130 | | | |
| 14 | −556.6911 | −202.0072 | 22.2126 | 148.3881 | 152.5669 | Silica |
| Space | | | 38.7188 | | | |
| 16 | −183.7199 | −558.8803 | 15.0000 | 156.5546 | 166.5750 | Silica |
| Space | | | 10.0674 | | | |
| 18 | 427.2527 | −612.2450 | 28.8010 | 177.4010 | 179.0292 | Silica |
| Space | | | 132.3320 | | | |
| 20 | Infinite | | −74.0000 | 184.6402 | | Reflection |

TABLE 1-continued

| Element Number | Radius of Curvature (mm) Front | Radius of Curvature (mm) Back | Thickness (mm) | Aperture Diameter (mm) Front | Aperture Diameter (mm) Back | Glass |
|---|---|---|---|---|---|---|
| 22 | −240.4810 | 2050.9592 | −33.3135 | 188.4055 | 185.3395 | Silica |
| Space | | | −29.3434 | | | |
| 24 | 421.7829 | −145.6176 | −12.0000 | 175.5823 | 169.0234 | Silica |
| Space | | | −4.2326 | | | |
| 26 | −150.4759 | 472.0653 | −46.5091 | 171.4244 | 169.9587 | Silica |
| Space | | | −2.0000 | | | |
| 28 | −1472.2790 | −138.2223 | −15.0000 | 165.3586 | 154.8084 | Silica |
| Space | | | −27.2060 | | | |
| 30 | Infinite | Infinite | −91.8186 | 155.6662 | 253.0917 | Silica |
| 36 | Infinite | | | 253.0917 | | Reflection |
| 30 | Infinite | Infinite | 91.8186 | 253.0917 | 253.0917 | Silica |
| Space | | | 2.0000 | | | |
| 32 | Infinite | Infinite | 6.0000 | 185.8693 | 186.8401 | Silica |
| Space | | | 17.9918 | | | |
| Stop | | | | 188.0655 | | |
| 34 | Aspheric | | −17.9918 | 188.0655 | | Reflection |
| 32 | Infinite | Infinite | −6.0000 | 183.5471 | 180.1419 | Silica |
| Space | | | −2.0000 | | | |
| 30 | Infinite | Infinite | −91.8186 | 178.3346 | 149.2832 | Silica |
| 30 | Infinite | Infinite | −70.000 | 149.2832 | 128.8604 | Silica |
| Space | | | −2.0000 | | | |
| 38 | Infinite | Infinite | −4.5000 | 127.9681 | 126.6552 | Silica |
| Space | | | −0.7500 | | | |
| 40 | −175.1330 | 1737.4442 | −17.7754 | 121.4715 | 118.2689 | Silica |
| Space | | | −0.7500 | | | |
| 42 | −108.8178 | −580.1370 | −18.2407 | 104.5228 | 97.7967 | Silica |
| Space | | | −0.7500 | | | |
| 44 | −202.2637 | −86.6025 | −31.1216 | 91.7061 | 57.4968 | Silica |
| Space | | | −2.3507 | | | |
| 46 | −122.1235 | −488.7122 | −17.9476 | 56.4818 | 41.1675 | Silica |
| Space | | | −0.2000 | | | |
| 48 | −160.8506 | −360.1907 | −6.1500 | 39.4528 | 33.5764 | Silica |
| Space | | | −4.000 | | | |
| 50 | Infinite | | | 26.5019 | | |

Concave mirror 34 has an aspheric reflective surface according to the following equation.

$$Z = \frac{(CURV) Y^2}{1 + (1 - (1+k)(CURV)^2 Y^2)^{1/2}} + (A) Y^4 + (B) Y^6 + (D) Y^{10} + (E) Y^{12} + (F) Y^{14}$$

wherein the constants are as follows,

CURV=−0.00289051

K=0.000000

A=6.08975×10$^{-11}$

B=2.64378×10$^{14}$

C=9.82237×10$^{-19}$

D=7.98056×10$^{-23}$

E=−5.96805×10$^{-27}$

F=4.85179×10$^{-31}$

The lens according to the construction in Table 1 is optimized for radiation centered on 248.4 nanometers. The single refracting material of fused silica and the large portion of refracting power restricts the spectral bandwidth of the embodiment illustrated in FIG. 1 to about 10 picometers or 0.01 nanometers. This spectral bandwidth is more than adequate for a line narrowed krypton fluoride excimer laser light source. The embodiment illustrated in FIG. 1 can be optimized for any wavelength for which fused silica transmits adequately.

Figure 2:
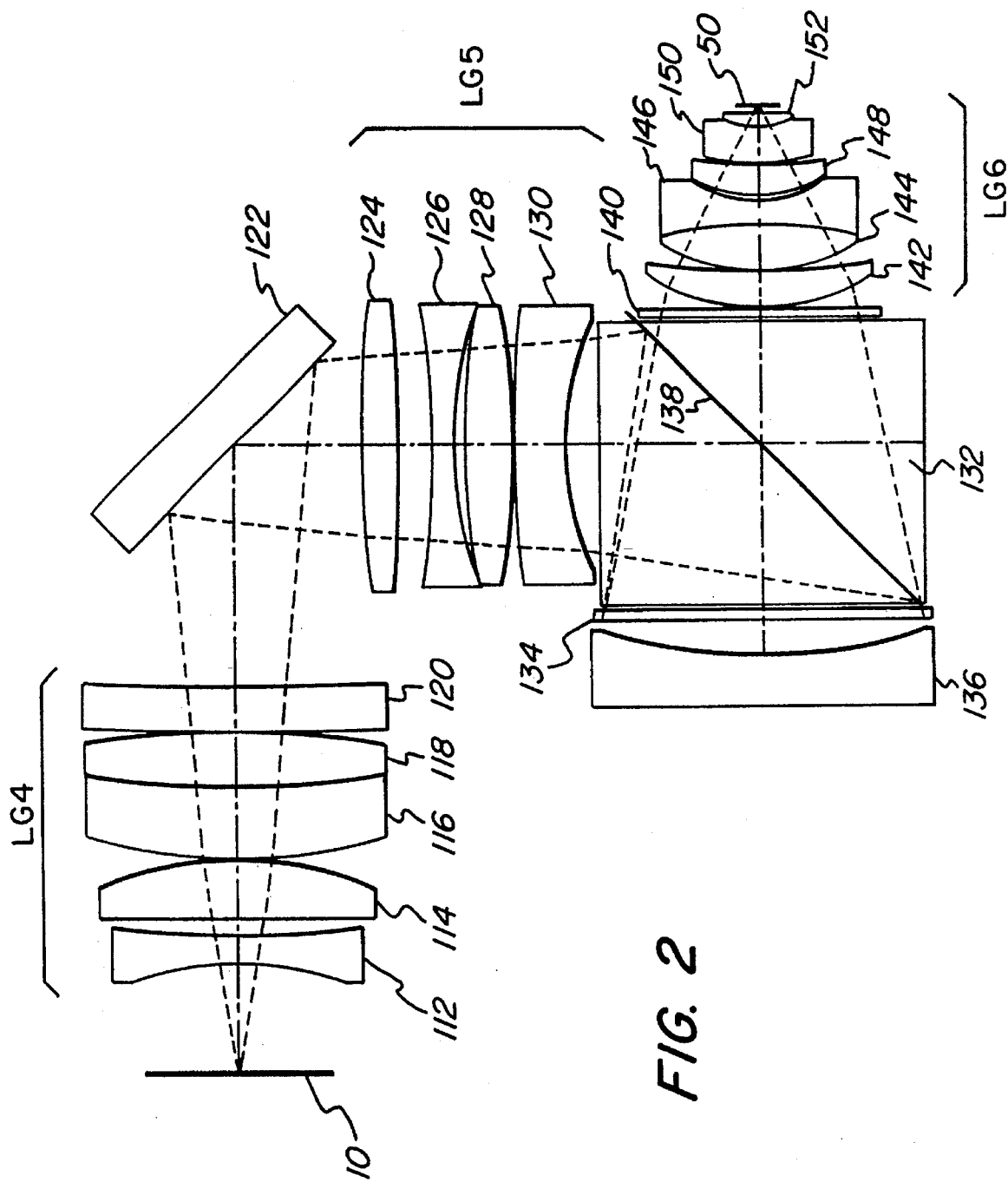
FIG. 2 is another embodiment of the present invention using two different refracting materials.

A wider spectral bandwidth can be achieved by the use of two optical materials with different dispersions. A second embodiment of the present invention is illustrated in FIG. 2. From its long conjugant end, it comprises an object or reticle plane 10, a lens group LG4, a folding mirror 122, a lens group LG5, a beamsplitter cube 132 having surface 138, a first quarter-waveplate 134, a concave mirror 136, a second quarter-waveplate 140, and lens group LG6. The image is formed at image or wafer plane 50. The lens group LG4 comprises a spaced doublet including negative lens 112 and positive lens 114, a weak positive lens 116, positive lens 118, and shell 120. The lens group LG5 comprises a positive lens 124, a negative lens 126, a positive lens 128, and a negative lens 130. The lens group LG6 comprises two positive lenses 142, 'cemented' doublet including positive lens 144 and negative lens 146, positive lens 148, and 'cemented' doublet including shell 150 and positive lens 152.

This second embodiment uses calcium fluoride in one of the individual positive lenses of the lens group LG4, negative lenses of the lens group LG5, and two of the positive lenses of the lens group LG6. The construction data of the second embodiment illustrated in FIG. 2 of the present invention is given in Table 2 below.

TABLE 2

| Element Number | Radius of Curvature (mm) Front | Radius of Curvature (mm) Back | Thickness (mm) | Aperture Diameter (mm) Front | Aperture Diameter (mm) Back | Glass |
|---|---|---|---|---|---|---|
| 10 | Infinite | | 60.4852 | | | |
| 112 | −205.5158 | 539.1791 | 15.2158 | 124.0926 | 137.3346 | Silica |
| Space | | | 8.8054 | | | |
| 114 | 2080.9700 | −210.6539 | 32.4984 | 142.6149 | 151.7878 | Silica |
| Space | | | 1.2676 | | | |
| 116 | 310.4463 | 700.3748 | 40.7304 | 162.4908 | 165.2126 | CaFl |
| Space | | | 0.5000 | | | |
| 118 | 634.1820 | −798.8523 | 27.5892 | 165.4595 | 166.4747 | Silica |
| Space | | | 0.5000 | | | |
| 120 | 1480.0597 | 1312.1247 | 25.4322 | 168.7516 | 164.7651 | Silica |
| Space | | | 136.2343 | | | |
| 122 | Infinite | | −74.0000 | 161.9590 | | Reflection |
| 124 | −761.9176 | 1088.9351 | −19.2150 | 160.3165 | 159.2384 | Silica |
| Space | | | −19.9465 | | | |
| 126 | 648.8361 | −202.5872 | −12.0000 | 155.1711 | 153.0635 | CaFl |
| Space | | | −7.6304 | | | |
| 128 | −400.4276 | 458.5060 | −25.8769 | 153.0635 | 153.8055 | Silica |
| Space | | | −2.0000 | | | |
| 130 | −818.0922 | −168.5034 | −27.5927 | 152.6663 | 147.5200 | CaFl |
| Space | | | −20.5014 | | | |
| 132 | Infinite | Infinite | −91.7553 | 148.6158 | 252.7349 | Silica |
| 138 | Infinite | | | 252.7349 | | Reflection |
| 132 | Infinite | Infinite | 91.7553 | 252.7349 | 252.7349 | Silica |
| Space | | | 2.0000 | | | |
| 134 | Infinite | Infinite | 6.0000 | 185.8070 | 187.0026 | Silica |
| Space | | | 18.1636 | | | |
| Stop | | | | 188.5681 | | |
| 136 | Aspheric | | −18.1636 | 188.5681 | | Reflection |
| 134 | Infinite | Infinite | −6.0000 | 184.2566 | 181.1084 | Silica |
| Space | | | −2.0000 | | | |
| 132 | Infinite | Infinite | −91.7553 | 179.3838 | 151.7747 | Silica |
| 132 | Infinite | Infinite | −70.0000 | 151.7747 | 133.3985 | Silica |
| Space | | | −2.0000 | | | |
| 140 | Infinite | Infinite | −4.5000 | 132.5690 | 131.3876 | Silica |
| Space | | | −0.5000 | | | |
| 142 | −112.0665 | −597.6805 | −21.4866 | 123.4895 | 119.2442 | Silica |
| Space | | | −0.5000 | | | |
| 144 | −116.3137 | 282.3140 | −24.0940 | 107.8451 | 101.2412 | CaFl |
| 146 | 282.3140 | −66.5293 | −13.7306 | 101.2412 | 72.6862 | Silica |
| Space | | | −2.6346 | | | |
| 148 | −77.2627 | −374.4800 | −17.9594 | 72.0749 | 62.7659 | Silica |
| Space | | | −0.5452 | | | |
| 150 | −130.1381 | −57.1295 | −20.8147 | 58.9696 | 37.4889 | Silica |
| 152 | −57.1295 | −7305.8777 | −6.1425 | 37.4889 | 34.3156 | CaFl |
| Space | | | −4.0000 | | | |
| Image | Infinite | | | 26.4992 | | | wherein the constants for the aspheric mirror 134 used in the equation after Table 1 are as follows,

CURV=−0.00286744

K=0.000000

A=−1.92013×10$^{-09}$

B=−3.50840×10$^{-14}$

C=2.95934×10$^{-19}$

D=−1.10495×10$^{-22}$

E=9.03439×10$^{-27}$

F=−1.39494×10$^{-31}$

This second embodiment is optimized for radiation centered on 193.3 nanometers and has a spectral bandwidth of about 200 picometers or 0.2 nanometers. A slightly line narrowed argon fluoride excimer laser is an adequate light source. Additionally, the design can be optimized for any wavelength for which both refractive materials transmit adequately. The bandwidth will generally increase for longer wavelengths, as the material dispersions decrease. For example, around 248.4 nanometers such a two-material design will operate over at least a 400 picometers, 0.4 nanometers bandwidth.

At wavelengths longer than 360 nanometers, a wider range of optical glasses begin to have adequate transmission. A third embodiment illustrated in FIG. 3 takes advantage of this wider selection of glasses and further reduced dispersion. From its long conjugant end, it comprises an object or reticle plane 10, a lens group LG7, a folding mirror 222, a lens group LG8, a beamsplitter cube 232 having a surface 238, a first quarter-waveplate 234, a concave mirror 236, a second quarter-waveplate 240, and lens group LG9. The image is formed at image or wafer plane 50. The lens group LG7 comprises a spaced doublet comprising negative lens 212 and positive lens 214, spaced doublet including positive lens 216 and negative lens 218, and positive lens 220. The lens group LG8 comprises a positive lens 224, a negative lens 226, a positive lens 228, and a negative lens 230. The lens group LG9 comprises a positive lenses 242, cemented doublet including positive lens 244 and negative lens 246, positive lens 248, and cemented doublet including shell 250 and positive lens 252.

Figure 3:
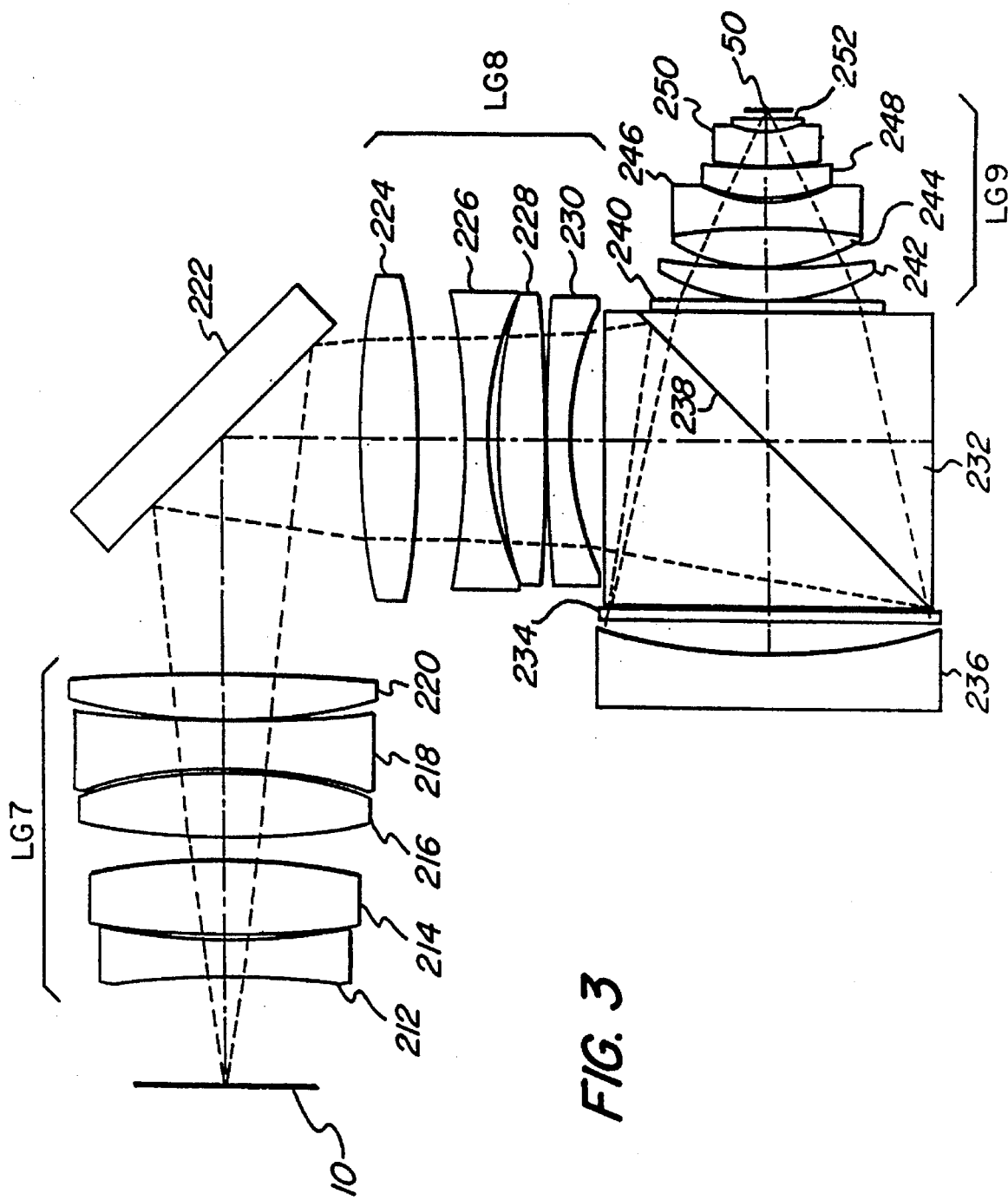
FIG. 3 is yet another embodiment of the present invention using more than two different refracting materials.

The construction data of the third embodiment illustrated in FIG. 3 is given in Table 3 below.

TABLE 3

| Element Number | Radius of Curvature (mm) Front | Back | Thickness (mm) | Aperture Diameter (mm) Front | Back | Glass |
|---|---|---|---|---|---|---|
| 10 | Infinite | | 59.2960 | | | |
| 212 | −620.7809 | 361.8305 | 20.2974 | 125.9406 | 134.7227 | PBM2Y |
| Space | | | 2.6174 | | | |
| 214 | 515.7935 | −455.1015 | 39.8858 | 135.3384 | 145.6015 | PBM2Y |
| Space | | | 14.7197 | | | |
| 216 | 431.3189 | −239.4002 | 36.9329 | 155.6269 | 157.3014 | BSL7Y |
| Space | | | 0.5000 | | | |
| 218 | −259.6013 | 685.3286 | 26.3534 | 156.9363 | 162.2451 | PBM2Y |
| Space | | | 1.4303 | | | |
| 220 | 361.5709 | −1853.2955 | 23.3934 | 168.7516 | 165.1801 | BAL15Y |
| Space | | | 131.8538 | | | |
| 222 | Infinite | | −77.8469 | 169.9390 | | Reflection |
| 224 | −429.2950 | 455.4247 | −32.3086 | 173.0235 | 171.1102 | PBL6Y |
| Space | | | −27.6206 | | | |
| 226 | 401.0363 | −180.0031 | −12.0000 | 159.3555 | 154.7155 | BSL7Y |
| Space | | | −5.6227 | | | |
| 228 | −258.4722 | 1301.3764 | −26.1321 | 154.7155 | 154.1517 | PBM8Y |
| Space | | | −2.0000 | | | |
| 230 | −1282.8931 | −180.2226 | −12.0000 | 153.1461 | 149.4794 | BSL7Y |
| Space | | | −19.7282 | | | |
| 232 | Infinite | Infinite | −91.7349 | 150.4585 | 252.6772 | Silica |
| 238 | Infinite | | | 252.6772 | | Reflection |
| 232 | Infinite | Infinite | 91.7349 | 252.6772 | 252.6772 | Space |
| Space | | | 2.0000 | | | |
| 234 | Infinite | Infinite | 6.0000 | 185.6435 | 186.7758 | Silica |
| Space | | | 18.2715 | | | |
| Stop | | | | 188.1745 | | |
| 236 | Aspheric | | −18.2715 | 188.1745 | | Reflection |
| 234 | Infinite | Infinite | −6.0000 | 183.6393 | 180.1377 | Silica |
| Space | | | −2.0000 | | | |
| 232 | Infinite | Infinite | −91.7349 | 178.3236 | 147.9888 | Silica |
| 232 | Infinite | Infinite | −70.0000 | 147.9888 | 126.9282 | Silica |
| Space | | | −2.0000 | | | |
| 240 | Infinite | Infinite | −4.5000 | 126.0289 | 124.6750 | Silica |
| Space | | | −0.5000 | | | |
| 242 | −119.8912 | −610.6840 | −18.6508 | 117.5305 | 113.4233 | BSM51Y |
| Space | | | −0.5000 | | | |
| 244 | −114.1327 | 384.9135 | −21.1139 | 102.6172 | 96.4137 | BSL7Y |
| 246 | 384.9135 | −70.2077 | −13.0576 | 96.4137 | 71.1691 | PBL26Y |
| Space | | | −2.8552 | | | |
| 248 | −85.7858 | −400.3240 | −16.9147 | 70.5182 | 61.2633 | BSM51Y |
| Space | | | −0.8180 | | | |
| 250 | −151.5235 | −54.0114 | −19.5810 | 57.6234 | 37.3909 | BSM51Y |
| 252 | −54.0114 | −2011.1057 | −6.3947 | 37.3909 | 34.2119 | PBL6Y |
| Space | | | −4.0000 | | | |
| Image | Infinite | | | 26.5002 | | | wherein the constants for the aspheric mirror 234 used in the equation after Table 1 as follows,

CURV=−0.00291648

K=0.000000

A=−1.27285×$10^{-9}$

B=−1.92865×$10^{-14}$

C=6.21813×$10^{-19}$

D=−6.80975×$10^{23}$

E=6.04233×$10^{-27}$

F=3.64479×$10^{-32}$

This third embodiment operates over a spectral bandwidth of 8 nanometers centered on 365.5 nanometers. A radiation of this spectral bandwidth can be provided by a filtered mercury arc lamp at the I-line waveband. The optical glasses other than fused silica used in this third embodiment are commonly known as I-line glasses. These optical glasses have the least absorption or solarization effects at the mercury I-line wavelength. These glasses may be found in a commonly available glass catalog provided by O'Hara Corporation, 50 Columbia Road, Branchburg Township, Somerville, N.J. 08876-3519, USA.

Figure 4:
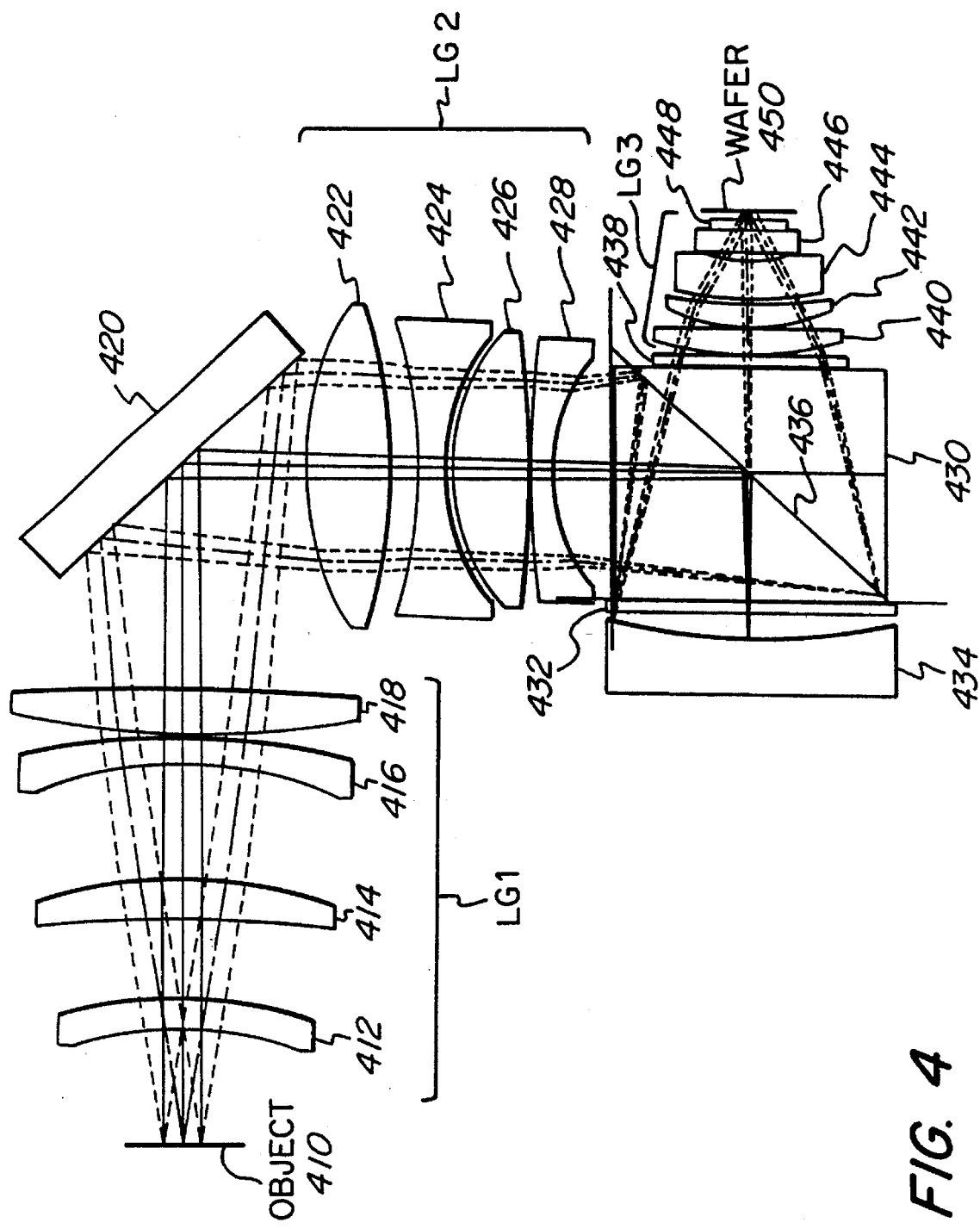
FIG. 4 is another embodiment of the present invention.

FIG. 4 illustrates a fourth embodiment of the optical reduction system of the present invention. This embodiment has a numerical aperture of 0.63 and can operate at a spectral bandwidth of 300 picometers, and preferably of 100 picometers, centered on 248.4 nanometers. From the long conjugate end, it includes an object or reticle plane 410, a first lens group LG1, a folding mirror 420, a second lens group LG2, a beamsplitter cube 430, a first quarter-waveplate 432, a concave mirror 434, a second quarter-waveplate 438, and a third lens group LG3. The image is formed at the image or wafer plane 450.

The first lens group LG1 comprises a shell 412, a spaced doublet including a positive lens 414 and a negative lens 416, and a positive lens 418. The second lens group LG2 comprises a positive lens 422, a spaced doublet including a negative lens 424 and a positive lens 426, and a negative lens 428. The third lens group LG3 comprises two positive lenses 440 and 442, a shell 444, and two positive lenses 446 and 448. Again, as in the embodiment illustrated in FIG. 1, the folding mirror 420 of FIG. 4 is not essential to the operation of the invention, but nevertheless permits the object 410 and image plane 450 to be parallel to each other which is convenient for the manufacture of semiconductor devices using photolithography.

The construction data of the fourth embodiment illustrated in FIG. 4 is given in Table 4 below.

This fourth embodiment is optimized for radiation centered on 248.4 nm. The single refracting material of fused silica and the large portion of refracting power restricts the spectral bandwidth of the embodiment depicted in FIG. 4. However, because the fourth embodiment has a maximum numerical aperture of 0.63 rather than of 0.7 as in the first three embodiments, the fourth embodiment provides acceptable imaging over a spectral full-width-half-maximum bandwidth of 300 picometers, or preferably of 100 picometers. Thus, in the former, an unnarrowed, or, in the latter, a

TABLE 4

| Element Number | Radius of Curvature (mm) Front | Radius of Curvature (mm) Back | Thickness (mm) | Aperture Diameter (mm) Front | Aperture Diameter (mm) Back | Glass |
|---|---|---|---|---|---|---|
| 410 | Infinite | | 63.3853 | | | |
| 412 | −183.5661CC | −215.7867CX | 17.0000 | 122.8436 | 130.6579 | Silica |
| Space | | | 46.6205 | | | |
| 414 | −601.1535CC | −230.9702CX | 21.4839 | 149.1476 | 153.3103 | Silica |
| Space | | | 68.8075 | | | |
| 416 | −195.1255CC | −345.4510CX | 15.0000 | 161.6789 | 170.1025 | Silica |
| Space | | | 3.0000 | | | |
| 418 | 435.8058CX | −1045.1785CX | 24.9351 | 177.4520 | 178.2672 | Silica |
| Space | | | 130.0000 | | | |
| | Decenter | (1) | | | | |
| 420 | Infinite | | −64.5000 | 180.3457 | | Reflection |
| 422 | −210.7910CX | 380.1625CX | −43.1418 | 181.6672 | 178.0170 | Silica |
| Space | | | −15.8065 | | | |
| 424 | 300.1724CC | −123.4555CC | −12.0000 | 166.7278 | 153.3103 | Silica |
| Space | | | −3.8871 | | | |
| 426 | −126.8951CX | 972.6391CX | −41.3263 | 154.8530 | 151.8327 | Silica |
| Space | | | −1.5000 | | | |
| 428 | −626.4905CX | −116.6456CC | −12.0000 | 147.6711 | 136.1163 | Silica |
| Space | | | −31.8384 | | | |
| 430 | Infinite | Infinite | −74.0000 | 137.2448 | 200.1127 | Silica |
| | Decenter (2) | | | | | |
| 436 | Infinite | | | 200.1127 | | Reflection |
| 430 | Infinite | Infinite | 74.0000 | 200.1127 | 200.1127 | Silica |
| Space | | | 2.0000 | | | |
| 432 | Infinite | Infinite | 6.0000 | 148.6188 | 149.0707 | Silica |
| Space | | | 14.4638 | | | |
| Stop | | | | 149.6392 | | |
| 434 | Aspheric | | −14.4638 | 149.6392 | | Reflection |
| 432 | Infinite | Infinite | −6.0000 | 144.8563 | 141.2737 | Silica |
| Space | | | −2.0000 | | | |
| 430 | Infinite | Infinite | −74.0000 | 139.3606 | 117.3979 | Silica |
| | Decenter (3) | | | | | |
| 430 | Infinite | Infinite | −61.0000 | 117.3979 | 100.5074 | Silica |
| Space | | | −2.0000 | | | |
| 438 | Infinite | Infinite | −4.5000 | 99.6617 | 98.4157 | Silica |
| Space | | | −1.2000 | | | |
| 440 | −157.8776CX | 2282.2178CX | −13.7501 | 94.8267 | 91.8775 | Silica |
| Space | | | −1.2000 | | | |
| 442 | −94.0059CX | −466.6659CC | −13.4850 | 82.8663 | 78.1418 | Silica |
| Space | | | −1.2000 | | | |
| 444 | −147.2485CX | −77.8924CC | −22.2075 | 72.7262 | 50.6555 | Silica |
| Space | | | −3.2091 | | | |
| 446 | −159.2880CX | −519.4850CC | −13.8321 | 49.5648 | 39.0473 | Silica |
| Space | | | −0.2000 | | | |
| 448 | −129.3683CX | −426.7350CC | −6.1500 | 37.3816 | 32.4880 | Silica |
| Space | Image Distance = | | −4.0000 | | | |
| 450 | Image | Infinite | | | | |

The constants for the aspheric mirror 434 used in equation (1) located after Table 1 are as follows:

CURV=−0.00332614

K=0.000000

A=−4.32261E-10

B=3.50228E-14

C=7.13264E-19

D=2.73587E-22 narrowed excimer laser can be employed for the illumination source.

The fourth embodiment differs from the first three embodiments in that the net power of LG1 and LG2 of the fourth embodiment is weakly positive rather than weakly negative as in the first three embodiments. In addition, this illustrates that the overall focal power of LG1 plus LG2 can be either positive or negative and still permit an infinitely distant entrance pupil to be imaged at or near the concave mirror 434.

Figure 5:
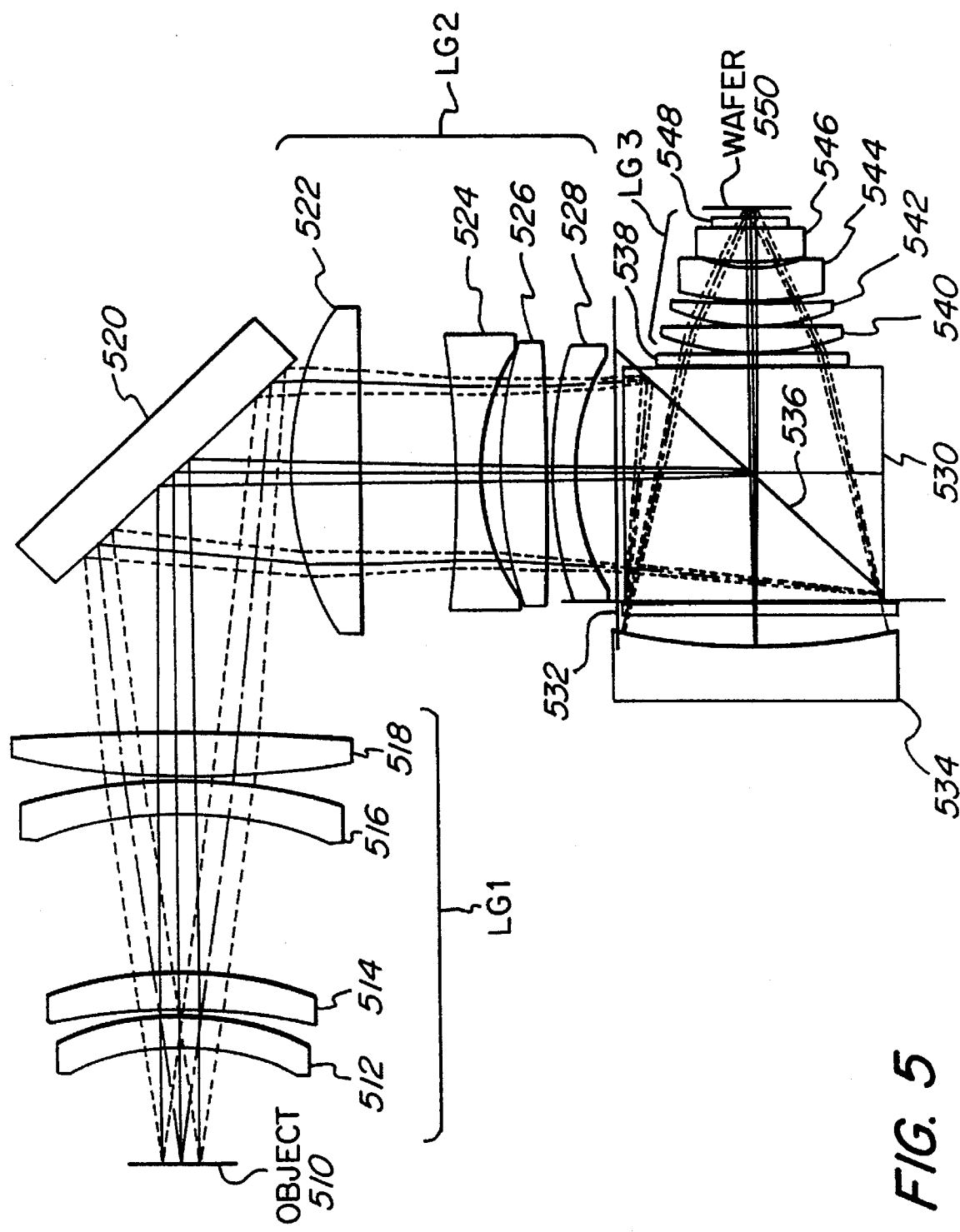
FIG. 5 is yet a further embodiment of the present invention.

FIG. 5 illustrates a fifth embodiment of the optical reduction system of the present invention. Preferably, this embodiment has a numerical aperture of 0.60 and operates at a spectral bandwidth of 300 picometers centered on 248.4 for the manufacture of semiconductor devices using photolithography.

The construction data of the fifth embodiment illustrated in FIG. 5 is given in Table 5 below.

TABLE 5

| Element Number | Radius of Curvature (mm) Front | Radius of Curvature (mm) Back | Thickness (mm) | Aperture Diameter (mm) Front | Aperture Diameter (mm) Back | Glass |
|---|---|---|---|---|---|---|
| 510 | Infinite | | 62.7514 | | | |
| 512 | −136.1154 CC | −152.5295 CX | 16.8300 | 120.7552 | 129.4354 | Silica |
| Space | | | 4.5206 | | | |
| 514 | −270.1396 CC | −191.8742 CX | 20.5341 | 132.9152 | 139.0377 | Silica |
| Space | | | 90.8476 | | | |
| 516 | −188.9000 CC | −284.7476 CX | 17.5000 | 156.1938 | 165.6567 | Silica |
| Space | | | 2.9700 | | | |
| 518 | 433.8174 CX | −841.5599 CX | 25.8293 | 173.8279 | 174.8334 | Silica |
| Space | | | 149.4549 | | | |
| | | Decenter(1) | | | | |
| 520 | Infinite | | −61.0000 | 177.2183 | | Reflection |
| 522 | −190.3251 CX | −8413.4836 CC | −34.4584 | 178.5071 | 174.2260 | Silica |
| Space | | | −51.5487 | | | |
| 524 | 690.5706 CC | −146.4997 CC | −11.8800 | 150.4109 | 141.8021 | Silica |
| Space | | | −10.6267 | | | |
| 526 | −265.9886 CX | 1773.5314 CX | −24.1851 | 142.1592 | 141.2400 | Silica |
| Space | | | −1.5000 | | | |
| 528 | −244.9899 CX | −142.8558 CC | −11.8800 | 139.3290 | 133.8967 | Silica |
| Space | | | −21.6411 | | | |
| 530 | Infinite | Infinite | −71.2800 | 134.3115 | 189.7826 | Silica |
| | | Decenter(2) | | | | |
| 536 | Infinite | | | 189.7826 | | Reflection |
| 530 | Infinite | Infinite | 71.2800 | 189.7826 | 189.7826 | Silica |
| Space | | | 1.9800 | | | |
| 532 | Infinite | Infinite | 5.9400 | 142.3429 | 142.6707 | Silica |
| Space | | | 18.5263 | | | |
| Stop | | | | 143.5034 | | |
| 534 | Aspheric | | −18.5263 | 143.5034 | | Reflection |
| 532 | Infinite | Infinite | −5.9400 | 134.2788 | 130.9398 | Silica |
| Space | | | −1.9800 | | | |
| 530 | Infinite | Infinite | −71.2800 | 130.1221 | 111.7247 | Silica |
| | | Decenter(3) | | | | |
| 530 | Infinite | Infinite | −60.4000 | 111.7247 | 96.1353 | Silica |
| Space | | | −1.9800 | | | |
| 538 | Infinite | Infinite | −4.4550 | 95.3562 | 94.2064 | Silica |
| Space | | | −1.1880 | | | |
| 540 | −127.4561 CX | −1398.8019 CC | −13.0104 | 90.4737 | 87.7002 | Silica |
| Space | | | −1.1880 | | | |
| 542 | −98.8795 CX | −424.1302 CC | −12.2874 | 80.7016 | 76.3270 | Silica |
| Space | | | −1.1880 | | | |
| 544 | −132.0104 CX | −70.9574 CC | −17.8706 | 71.0789 | 53.4306 | Silica |
| Space | | | −3.1246 | | | |
| 546 | −123.1071 CX | −585.4471 CC | −19.9496 | 52.6417 | 38.2256 | Silica |
| Space | | | −0.1980 | | | |
| 548 | −137.8349 CX | −292.6179 CC | −6.0885 | 36.7251 | 31.8484 | Silica |
| Space | | Image Distance = | −4.0000 | | | |
| 550 | Image | Infinite | | | 26.5000 | | nanometers. From the long conjugate end, it includes an object or reticle plane 510, a first lens group LG1, a folding mirror 520, a second lens group LG2, a beamsplitter cube 530, a first quarter-waveplate 532, a concave mirror 534, a second quarter-waveplate 538, and a third lens group LG3. The image is formed at the image or wafer plane.

The first lens group LG1 comprises a shell 512, a spaced doublet including a positive lens 514 and a negative lens 516, and a positive lens 518. The second lens group LG2 comprises a positive lens 522, a spaced doublet including a negative lens 524 and a positive lens 526, and a negative lens 528. The third lens group LG3 comprises two positive lenses 540 and 542, a shell 544, and two positive lenses 546 and 548. Again, as in the embodiment illustrated in FIG. 1, the folding mirror 520 of FIG. 5 is not essential to the operation of the invention, but nevertheless permits the object and image planes to be parallel to each other which is convenient The constants for the aspheric mirror 534 used in equation (1) located after Table 1 are as follows:

CURV=−0.00325995

K=0.000000

A=−6.91799E-10

B=5.26952E-15

C=6.10046E-19

D=1.59429E-22

This fifth embodiment is optimized for radiation centered on 248.4 nm. The single refracting material of fused silica and the large portion of refracting power restricts the spectral bandwidth of the embodiment depicted in FIG. 5. However, because the fifth embodiment has a maximum numerical aperture of 0.6 rather than of 0.7 as in the first three embodiments, the fifth embodiment provides acceptable imaging over a spectral full-width-half-maximum bandwidth of 300 picometers. Thus, an unnarrowed excimer laser can be employed for an illumination source. The fifth embodiment differs from the first three embodiments in that the net power of LG1 and LG2 of the fifth embodiment is weakly positive rather than weakly negative as in the first three embodiments. In addition, this illustrates that the overall focal power of LG1 plus LG2 can be either positive or negative and still permit an infinitely distant entrance pupil to be imaged at or near the concave mirror 534.

Although the preferred embodiments have been illustrated and described, it will obvious to those skilled in the art that various modifications may be made without departing from the spirit and scope of thid invention.

What is claimed:

1. catadioptric optical reduction system having an object space numerical aperture, from the long conjugate end to the short conjugate end, comprising:

first lens means for providing a negative power having an emerging numerical aperture, the emerging numerical aperture being larger than the object space numerical aperture;

a beamsplitter;

a concave mirror; and second lens means for providing a positive power, wherein the negative power of said first lens means provides only enough power to image an entrance pupil of the system at infinity to an aperture stop at or near said mirror, and the positive power of said second lens means provides substantially all of the power of the system and images the exit pupil of the system to infinity.

2. A catadioptric optical reduction system from the long conjugate end to the short conjugate end, comprising:

a first lens group of positive power, said first lens group having an entering numerical aperture;

a second lens group of negative power, said second lens group separated from said first lens group and having an emerging numerical aperture greater than the entering numerical aperture of said first lens group;

a beamsplitter;

a quarter waveplate;

a concave mirror;

a third lens group of positive power; and wherein the positive power of said first lens group provides enough power to image an entrance pupil of the system at infinity through said second lens group to an aperture stop at or near said mirror, the negative power of said second lens group provides the necessary conjugates for said concave mirror, and the positive power of said third lens group provides the remainder of the total system power and images the exit pupil of the system to infinity.

3. An optical reduction system as in claim further comprising:

a first quarter-waveplate placed between said beamsplitter and said concave mirror.

4. An optical reduction system as in claim 3 further comprising:

a second quarter-waveplate placed between said beamsplitter and said second lens means.

5. An optical reduction system as in claim 2 wherein:

said first lens group includes refractive elements made from at least two different materials; and said second lens group includes refractive elements made from at least two different materials.

6. An optical reduction system as in claim 2 wherein said first lens group comprises:

at least one lens of positive power;

a first lens of substantially zero power; and a first doublet, whereby said at least one lens of positive power images an entrance pupil at infinity to an aperture stop near said mirror, and said first lens of substantially zero power and said first doublet help correct aberrations such as astigmatism, field curvature, and distortion.

7. An optical reduction system as in claim 6 wherein:

said first doublet is an air spaced doublet.

8. A catadioptric optical reduction system from the long conjugate end to the short conjugate end, comprising:

a first lens group of positive power;

a second lens group of negative power;

a beamsplitter;

a quarter waveplate;

a concave mirror;

a third lens group of positive power;

said first lens group including, at least one lens of positive power;

a first lens of substantially zero power; and a first doublet, whereby said first lens of substantially zero power and said first doublet help correct aberrations such as astigmatism, field curvature, and distortion, said second lens group including, at least one lens of negative power;

a positive lens; and a second doublet, whereby said at least one lens of negative power provides a diverging beam for said beamsplitter and said mirror, said positive lens provides lateral color correction, and said second doublet helps to correct for spherical aberration and coma, and wherein the positive power of said first lens group provides enough power to image the entrance pupil of the system at infinity through said second lens group to an aperture stop at or near said mirror, the negative power of said second lens group provides the necessary conjugates for said concave mirror, and the positive power of said third lens group provides the remainder of the total system power and images the exit pupil of the system to infinity.

9. An optical reduction system as in claim 8 wherein said third lens group comprises:

a first subgroup of at least two positive lenses;

a second lens of substantially zero power; and a second subgroup of at least two positive lenses, whereby said first subgroup of at lease two positive lenses provides a high numerical aperture at an image and exit pupil and infinity, and said second lens of substantially zero power and said second subgroup of at least two positive lenses provide high-order aberration correction.

10. An optical reduction system as in claim 9 wherein:

said second doublet is a cemented doublet.

11. An optical reduction system as in claim 2 further comprising:

a folding placed between said first lens group and said second lens group.

12. An optical reduction system as in claim 2 wherein:

said mirror is aspheric.

13. An optical reduction system as in claim 1 wherein:
said first lens means and said second lens means include refractive elements made of at least two different materials.

14. An optical reduction system comprising:
a construction according to the following construction data

TABLE 1

| Element Number | Radius of Curvature (mm) Front | Radius of Curvature (mm) Back | Thickness (mm) | Aperture Diameter (mm) Front | Aperture Diameter (mm) Back | Glass |
|---|---|---|---|---|---|---|
| 10 | Infinite | | 63.3853 | | | |
| 12 | −158.7745 | −177.8800 | 15.0000 | 124.0478 | 131.7725 | Silica |
| Space | | | 36.1130 | | | |
| 14 | −556.6911 | −202.0072 | 22.2126 | 148.3881 | 152.5669 | Silica |
| Space | | | 38.7188 | | | |
| 16 | −183.7199 | −558.8803 | 15.0000 | 156.5546 | 166.5750 | Silica |
| Space | | | 10.0674 | | | |
| 18 | 427.2527 | −612.2450 | 28.8010 | 177.4010 | 179.0292 | Silica |
| Space | | | 132.3320 | | | |
| 20 | Infinite | | −74.0000 | 184.6402 | | Reflection |
| 22 | −240.4810 | 2050.9592 | −33.3135 | 188.4055 | 185.3395 | Silica |
| Space | | | −29.3434 | | | |
| 24 | 421.7829 | −145.6176 | −12.0000 | 175.5823 | 169.0234 | Silica |
| Space | | | −4.2326 | | | |
| 26 | −150.4759 | 472.0653 | −46.5091 | 171.4244 | 169.9587 | Silica |
| Space | | | −2.0000 | | | |
| 28 | −1472.2790 | −138.2223 | −15.0000 | 165.3586 | 154.8084 | Silica |
| Space | | | −27.2060 | | | |
| 30 | Infinite | Infinite | −91.8186 | 155.6662 | 253.0917 | Silica |
| 36 | Infinite | | | 253.0917 | | Reflection |
| 30 | Infinite | Infinite | 91.8186 | 253.0917 | 253.0917 | Silica |
| Space | | | 2.0000 | | | |
| 32 | Infinite | Infinite | 6.0000 | 185.8693 | 186.8401 | Silica |
| Space | | | 17.9918 | | | |
| Stop | | | | 188.0655 | | |
| 34 | Aspheric | | −17.9918 | 188.0655 | | Reflection |
| 32 | Infinite | Infinite | −6.0000 | 183.5471 | 180.1419 | Silica |
| Space | | | −2.0000 | | | |
| 30 | Infinite | Infinite | −91.8186 | 178.3346 | 149.2832 | Silica |
| 30 | Infinite | Infinite | −70.000 | 149.2832 | 128.8604 | Silica |
| Space | | | −2.0000 | | | |
| 38 | Infinite | Infinite | −4.5000 | 127.9681 | 126.6552 | Silica |
| Space | | | −0.7500 | | | |
| 40 | −175.1330 | 1737.4442 | −17.7754 | 121.4715 | 118.2689 | Silica |
| Space | | | −0.7500 | | | |
| 42 | −108.8178 | −580.1370 | −18.2407 | 104.5228 | 97.7967 | Silica |
| Space | | | −0.7500 | | | |
| 44 | −202.2637 | −86.6025 | −31.1216 | 91.7061 | 57.4968 | Silica |
| Space | | | −2.3507 | | | |
| 46 | −222.1235 | −488.7122 | −17.9476 | 56.4818 | 41.1675 | Silica |
| Space | | | −0.2000 | | | |
| 48 | −160.8506 | −360.1907 | −6.1500 | 39.4528 | 33.5764 | Silica |
| Space | | | −4.000 | | | |
| 50 | Infinite | | | 26.5019 | | |

15. A catadioptric optical reduction system having a relatively high numerical aperture, from the long conjugate end to the short conjugate end, comprising:
a first doublet;
a first positive lens;
a second positive lens;
a shell;
a third positive lens;
a first negative lens;
a forth positive lens;
a second negative lens;
a beamsplitter cube;
a first quarter-wave plate;
a concave mirror;
a second quarter-wave plate;
a fifth positive lens;
a second doublet;
a sixth positive lens; and
a third doublet, arranged such that radiation entering the system passes through said first doublet, said first positive lens, said second positive lens, said shell, said third positive lens, said first negative lens, said second negative lens; said beamsplitter cube, said first quarter-wave plate, and is reflected by said concave mirror back through said first quarter-wave plate and said beamsplitter cube, and through said second quarter-wave plate, said fifth positive lens, said second doublet; said sixth positive lens, and said third doublet.

16. An optical reduction system as in claim 15 further comprising:
a folding mirror placed between said shell and said third positive lens.

17. An optical reduction system as in claim 16 having:

a construction according to the following construction data

TABLE 2

| Element Number | Radius of Curvature (mm) Front | Radius of Curvature (mm) Back | Thickness (mm) | Aperture Diameter (mm) Front | Aperture Diameter (mm) Back | Glass |
|---|---|---|---|---|---|---|
| 10 | Infinite | | 60.4852 | | | |
| 112 | −205.5158 | 539.1791 | 15.2158 | 124.0926 | 137.3346 | Silica |
| Space | | | 8.8054 | | | |
| 114 | 2080.9700 | −210.6539 | 32.4984 | 142.6149 | 151.7878 | Silica |
| Space | | | 1.2676 | | | |
| 116 | 310.4463 | 700.3748 | 40.7304 | 162.4908 | 165.2126 | CaFl |
| Space | | | 0.5000 | | | |
| 118 | 634.1820 | −798.8523 | 27.5892 | 165.4595 | 166.4747 | Silica |
| Space | | | 0.5000 | | | |
| 120 | 1480.0597 | 1312.1247 | 25.4322 | 168.7516 | 164.7651 | Silica |
| Space | | | 136.2343 | | | |
| 122 | Infinite | | −74.0000 | 161.9590 | | Reflection |
| 124 | −761.9176 | 1088.9351 | −19.2150 | 160.3165 | 159.2384 | Silica |
| Space | | | −19.9465 | | | |
| 126 | 648.8361 | −202.5872 | −12.0000 | 155.1711 | 153.0635 | CaFl |
| Space | | | −7.6304 | | | |
| 128 | −400.4276 | 458.5060 | −25.8769 | 153.0635 | 153.8055 | Silica |
| Space | | | −2.0000 | | | |
| 130 | −818.0922 | −168.5034 | −27.5927 | 152.6663 | 147.5200 | CaFl |
| Space | | | −20.5014 | | | |
| 132 | Infinite | Infinite | −91.7553 | 148.6158 | 252.7349 | Silica |
| 138 | Infinite | | | 252.7349 | | Reflection |
| 132 | Infinite | Infinite | 91.7553 | 252.7349 | 252.7349 | Silica |
| Space | | | 2.0000 | | | |
| 134 | Infinite | Infinite | 6.0000 | 185.8070 | 187.0026 | Silica |
| Space | | | 18.1636 | | | |
| Stop | | | | 188.5681 | | |
| 136 | Aspheric | | −18.1636 | 188.5681 | | Reflection |
| 134 | Infinite | Infinite | −6.0000 | 184.2566 | 181.1084 | Silica |
| Space | | | −2.0000 | | | |
| 132 | Infinite | Infinite | −91.7553 | 179.3838 | 151.7747 | Silica |
| 132 | Infinite | Infinite | −70.0000 | 151.7747 | 133.3985 | Silica |
| Space | | | −2.0000 | | | |
| 140 | Infinite | Infinite | −4.5000 | 132.5690 | 131.3876 | Silica |
| Space | | | −0.5000 | | | |
| 142 | −112.0665 | −597.6805 | −21.4866 | 123.4895 | 119.2442 | Silica |
| Space | | | −0.5000 | | | |
| 144 | −116.3137 | 282.3140 | −24.0940 | 107.8451 | 101.2412 | CaFl |
| 146 | 282.3140 | −66.5293 | −13.7306 | 101.2412 | 72.6862 | Silica |
| Space | | | −2.6346 | | | |
| 148 | −77.2627 | −374.4800 | −17.9594 | 72.0749 | 62.7659 | Silica |
| Space | | | −0.5452 | | | |
| 150 | −130.1381 | −57.1295 | −20.8147 | 58.9696 | 37.4889 | Silica |
| 152 | −57.1295 | −7305.8777 | −6.1425 | 37.4889 | 34.3156 | CaFl |
| Space | | | −4.0000 | | | |
| Image | Infinite | | | 26.4992 | | |

18. A catadioptric optical reduction system having a relatively high numerical aperture, from the long conjugate end to the short conjugate end, comprising:

a first doublet;

a second doublet;

a first positive lens;

a second positive lens;

a first negative lens;

a third positive lens;

a second negative lens;

a beamsplitter cube;

a first quarter-wave plate;

a concave mirror;

a second quarter-wave plate;

a fourth positive lens;

a third doublet;

a fifth positive lens;

a shell; and a sixth positive lens, arranged such that radiation entering the system passes through said first doublet, said second doublet, said first positive lens, said second positive lens, said first negative lens, said third positive lens, said second negative lens, said beamsplitter cube, said first quarter-wave plate, and is reflected by said concave mirror back through said first quarter-wave plate and said beamsplitter cube, and through said second quarter-wave plate, said fourth positive lens, said third doublet, said fifth positive lens, said shell, and said sixth positive lens.

19. An optical reduction system as in claim 18 further comprising:

a folding mirror placed between said first positive lens and said second positive lens.

20. An optical reduction system as in claim 19 having:

a construction according to the following construction data

TABLE 3

| Element Number | Radius of Curvature (mm) Front | Radius of Curvature (mm) Back | Thickness (mm) | Aperture Diameter (mm) Front | Aperture Diameter (mm) Back | Glass |
|---|---|---|---|---|---|---|
| 10 | Infinite | | 59.2960 | | | |
| 212 | −620.7809 | 361.8305 | 20.2974 | 125.9406 | 134.7227 | PBM2Y |
| Space | | | 2.6174 | | | |
| 214 | 515.7935 | −455.1015 | 39.8858 | 135.3384 | 145.6015 | PBM2Y |
| Space | | | 14.7197 | | | |
| 216 | 431.3189 | −239.4002 | 36.9329 | 155.6269 | 157.3014 | BSL7Y |
| Space | | | 0.5000 | | | |
| 218 | −259.6013 | 685.3286 | 26.3534 | 156.9363 | 162.2451 | PBM2Y |
| Space | | | 1.4303 | | | |
| 220 | 361.5709 | −1853.2955 | 23.3934 | 168.7516 | 165.1801 | BAL15Y |
| Space | | | 311.8538 | | | |
| 222 | Infinite | | −77.8649 | 169.9390 | | Reflection |
| 224 | −429.2950 | 455.4247 | −32.3086 | 173.0235 | 171.1102 | PBL6Y |
| Space | | | −27.6206 | | | |
| 226 | 401.0363 | −180.0031 | −12.0000 | 159.3555 | 154.7155 | BSL7Y |
| Space | | | −5.6227 | | | |
| 228 | −258.4722 | 1301.3764 | −26.1321 | 154.7155 | 154.1517 | PBM8Y |
| Space | | | −2.0000 | | | |
| 230 | −1282.8931 | −180.2226 | −12.0000 | 153.1461 | 149.4794 | BSL7Y |
| Space | | | −19.7282 | | | |
| 232 | Infinite | Infinite | −91.7349 | 150.4585 | 252.6772 | Silica |
| 238 | Infinite | | | 252.6772 | | Reflection |
| 232 | Infinite | Infinite | 91.7349 | 252.6772 | 252.6772 | Silica |
| Space | | | 2.0000 | | | |
| 234 | Infinite | Infinite | 6.0000 | 185.6435 | 186.7758 | Silica |
| Space | | | 18.2715 | | | |
| Stop | | | | 188.1745 | | |
| 236 | Aspheric | | −18.2715 | 188.1745 | | Reflection |
| 234 | Infinite | Infinite | −6.0000 | 183.6393 | 180.1377 | Silica |
| Space | | | −2.0000 | | | |
| 232 | Infinite | Infinite | −91.7349 | 178.3236 | 147.9888 | Silica |
| 232 | Infinite | Infinite | −70.0000 | 147.9888 | 126.9282 | Silica |
| Space | | | −2.0000 | | | |
| 240 | Infinite | Infinite | −4.5000 | 126.0289 | 124.6750 | Silica |
| Space | | | −0.5000 | | | |
| 242 | −119.8912 | −610.6840 | −18.6508 | 117.5305 | 113.4233 | BSM51Y |
| Space | | | −0.5000 | | | |
| 244 | −114.1327 | 384.9135 | −21.1139 | 102.6172 | 96.4137 | BSL7Y |
| 246 | 384.9135 | −70.2077 | −13.0576 | 96.4137 | 71.1691 | PBL26Y |
| Space | | | −2.8852 | | | |
| 248 | −85.7858 | −400.3240 | −16.9147 | 70.5182 | 61.2633 | BSM51Y |
| Space | | | −0.8180 | | | |
| 250 | −151.5235 | −54.0114 | −19.5810 | 57.6234 | 37.3909 | BSM51Y |
| 252 | −54.0114 | −2011.1057 | −6.3947 | 37.3909 | 34.2119 | PBL6Y |
| Space | | | −4.0000 | | | |
| Image | Infinite | | | 26.5002 | | |

21. An optical reductions system as in claim 1, 2, 3, 4, 5, 6, 7, 8, 9, 10, 11, 12, 13, or 14, wherein said beamsplitter is a cube.

22. An optical reduction system as in claim 1, 2, 3, 4, 5, 6, 7, 8, 9, 10, 11, 12, 13, or 14, wherein said aperture stop is between said beamsplitter and said concave mirror.

23. An optical reduction system as in claim 22, wherein a variable aperture is placed between said beamsplitter and said concave mirror.

24. An optical reduction system as in claim 1, 2, 3, 4, 5, 6, 7, 8, 9, 10, 11, 12, 13 or 14, wherein said concave mirror includes a reduction ratio of between 1.6 and 2.7 times that of the total system reduction ratio.

25. A catadioptric optical reduction system having a relatively high numerical aperture, from the long conjugate end to the short conjugate end, comprising:

a first lens group of positive power;

a second lens group of negative power;

a beamsplitter;

a concave mirror;

a third lens group of positive power;

a first quarter-waveplate placed between said beamsplitter and said concave mirror;

a second quarter-waveplate placed between said beamsplitter and said third lens group; and wherein the positive power of said first and second lens groups provide only enough power to image an entrance pupil of the system at infinity to an aperture stop at or near said mirror, the negative power of said second lens group provides the correct conjugates for said concave mirror, and the positive power of said third lens group provides the remainder of the total system power and images the exit pupil of the system to infinity.

26. An optical reduction system as in claim 25, wherein the first quarter-waveplate and/or second quarter-waveplate are true zero order quarter waveplates.

27. A catadioptric optical reduction system having a relatively high numerical aperture, from the long conjugate end to the short conjugate end, comprising:

a first lens group of positive power;

a second lens group of negative power, said first and second lens group having a net power;

a beamsplitter, the net power of said first and second lens group resulting in a non-collimated beam entering said beamsplitter from said first and second lens group;

a concave mirror, the net power of said first and second lens group providing only enough power to image the system entrance pupil at infinity to an aperture stop at or near said concave mirror; and a third lens group of positive power;

arranged such that radiation entering said system passes through said first lens group, said second lens group, said beamsplitter, and is reflected by said concave mirror back through said beamsplitter and through said third lens group.

28. An optical reduction system as in claim 2 having a construction according to the following data

TABLE 4

| Element Number | Radius of Curvature (mm) Front | Radius of Curvature (mm) Back | Thickness (mm) | Aperture Diameter (mm) Front | Aperture Diameter (mm) Back | Glass |
|---|---|---|---|---|---|---|
| 410 | Infinite | | 63.3853 | | | |
| 412 | −183.5661 CC | −215.7867 CX | 17.0000 | 122.8436 | 130.6579 | Silica |
| Space | | | 46.6205 | | | |
| 414 | −601.1535 CC | −230.9702 CX | 21.4839 | 149.1476 | 153.3103 | Silica |
| Space | | | 68.8705 | | | |
| 416 | −195.1255 CC | −345.4510 CC | 15.0000 | 161.6789 | 170.1025 | Silica |
| Space | | | 3.0000 | | | |
| 418 | 435.8058 CX | −1045.1785 CX | 24.9351 | 177.4520 | 178.2672 | Silica |
| Space | | | 130.0000 | | | |
| | Decenter(1) | | | | | |
| 420 | Infinite | | −64.5000 | 180.3457 | | Reflection |
| 422 | −210.7910 CX | 380.1625 CX | −43.1418 | 181.6672 | 178.0170 | Silica |
| Space | | | −15.8065 | | | |
| 424 | 300.1724 CC | −123.4555 CC | −12.0000 | 166.7278 | 153.3103 | Silica |
| Space | | | −3.8871 | | | |
| 426 | −126.8951 CX | 972.6391 CX | −41.3263 | 154.8530 | 151.8327 | Silica |
| Space | | | −1.5000 | | | |
| 428 | −626.4905 CX | −116.6456 CC | −12.0000 | 147.6711 | 136.1163 | Silica |
| Space | | | −31.8384 | | | |
| 430 | Infinite | Infinite | −74.0000 | 137.2448 | 200.1127 | Silica |
| | Decenter(2) | | | | | |
| 436 | Infinite | | | 200.1127 | | Reflection |
| 430 | Infinite | Infinite | 74.0000 | 200.1127 | 200.1127 | Silica |
| Space | | | 2.0000 | | | |
| 432 | Infinite | Infinite | 6.0000 | 148.6188 | 149.0707 | Silica |
| Space | | | 14.4638 | | | |
| Stop | | | | 149.6392 | | |
| 434 | Aspheric | | −14.4638 | 149.6392 | | Reflection |
| 432 | Infinite | Infinite | −6.0000 | 144.8563 | 141.2737 | Silica |
| Space | | | −2.0000 | | | |
| 430 | Infinite | Infinite | −74.0000 | 139.3606 | 117.3979 | Silica |
| | Decenter(3) | | | | | |
| 430 | Infinite | Infinite | −61.0000 | 117.3979 | 100.5074 | Silica |
| Space | | | −2.0000 | | | |
| 438 | Infinite | Infinite | −4.5000 | 99.6617 | 98.4157 | Silica |
| Space | | | −1.2000 | | | |
| 440 | −157.8776 CX | 2282.2178 CX | −13.7501 | 94.8267 | 91.8775 | Silica |
| Space | | | −1.2000 | | | |
| 442 | −94.0059 CX | −466.6659 CC | −13.4850 | 82.8663 | 78.1418 | Silica |
| Space | | | −1.2000 | | | |
| 444 | −147.2485 CX | −77.8924 CC | −22.2075 | 72.7262 | 50.6555 | Silica |
| Space | | | −3.2091 | | | |
| 446 | −159.2880 CX | −519.4850 CC | −13.8321 | 49.5648 | 39.0473 | Silica |
| Space | | | −0.2000 | | | |
| 448 | −129.3683 CX | −426.7350 CC | −6.1500 | 37.3816 | 32.4880 | Silica |
| Space | Image Distance = | | −4.0000 | | | |
| 450 | Image | Infinte | | | 26.5003 | |

29. An optical reduction system as in claim 2 having a construction according to the following data

TABLE 5

| Element Number | Radius of Curvature (mm) Front | Radius of Curvature (mm) Back | Thickness (mm) | Aperture Diameter (mm) Front | Aperture Diameter (mm) Back | Glass |
|---|---|---|---|---|---|---|
| 510 | Infinite | | 62.7514 | | | |
| 512 | −136.1154 CC | −152.5295 CX | 16.8300 | 120.7552 | 129.4354 | Silica |
| Space | | | 4.5206 | | | |
| 514 | −270.1396 CC | −191.8742 CX | 20.5341 | 132.9152 | 139.0377 | Silica |
| Space | | | 90.8476 | | | |
| 516 | −188.9000 CC | −284.7476 CX | 17.5000 | 156.1938 | 165.6567 | Silica |
| Space | | | 2.9700 | | | |
| 518 | 433.8174 CX | −841.5599 CX | 25.8293 | 173.8279 | 174.8334 | Silica |
| Space | | | 149.4549 | | | |
| | Decenter(1) | | | | | |
| 520 | Infinite | | −61.0000 | 177.2183 | | Reflection |
| 522 | −190.3251 CX | −8413.4836 CC | −34.4584 | 178.5071 | 174.2260 | Silica |
| Space | | | −51.5487 | | | |
| 524 | 690.5706 CC | −146.4997 CC | −11.8800 | 150.4109 | 141.8021 | Silica |
| Space | | | −10.6267 | | | |
| 526 | −265.9886 CX | 1773.5314 CX | −24.1851 | 142.1592 | 141.2400 | Silica |
| Space | | | −1.5000 | | | |
| 528 | −244.9899 CX | −142.8558 CC | −11.8800 | 139.3290 | 133.8967 | Silica |
| Space | | | −21.6411 | | | |
| 530 | Infinite | Infinite | −71.2800 | 134.3115 | 189.7826 | Silica |
| | Decenter(2) | | | | | |
| 536 | Infinite | | | 189.7826 | | Reflection |
| 530 | Infinite | Infinite | 71.2800 | 189.7826 | 189.7826 | Silica |
| Space | | | 1.9800 | | | |
| 532 | Infinite | Infinite | 5.9400 | 142.3429 | 142.6707 | Silica |
| Space | | | 18.5263 | | | |
| Stop | | | | 143.5034 | | |
| 534 | Aspheric | | −18.5263 | 143.5034 | | Reflection |
| 532 | Infinite | Infinite | −5.9400 | 134.2788 | 130.9398 | Silica |
| Space | | | −1.9800 | | | |
| 530 | Infinite | Infinite | −71.2800 | 130.1221 | 111.7247 | Silica |
| | Decenter(3) | | | | | |
| 530 | Infinite | Infinite | −60.4000 | 111.7247 | 96.1353 | Silica |
| Space | | | −1.9800 | | | |
| 538 | Infinite | Infinite | −4.4550 | 95.3562 | 94.2064 | Silica |
| Space | | | −1.1880 | | | |
| 540 | −127.4561 CX | −1398.8019 CC | −13.0104 | 90.4737 | 87.7002 | Silica |
| Space | | | −1.1880 | | | |
| 542 | −98.8795 CX | −424.1302 CC | −12.2874 | 80.7016 | 76.3270 | Silica |
| Space | | | −1.1880 | | | |
| 544 | −132.0104 CX | −70.9574 CC | −17.8706 | 71.0789 | 53.4306 | Silica |
| Space | | | −3.1246 | | | |
| 546 | −123.1071 CX | −585.4471 CC | −19.9496 | 52.6417 | 38.2256 | Silica |
| Space | | | −0.1980 | | | |
| 548 | −137.8349 CX | −292.6179 CC | −6.0885 | 36.7251 | 31.8484 | Silica |
| Space | Image Distance = | | −4.0000 | | | |
| 550 | Image | Infinite | | 26.5000 | | |

30. A catadioptric optical reduction system having an image space numerical aperture and an object space numerical aperture, from the long conjugate end to the short conjugate end, comprising:

a first lens group of positive power;

a second lens group of negative power, said second lens group having an emerging numerical aperture, the emerging numerical aperture being substantially similar to the object space numerical aperture;

a beamsplitter;

a concave mirror; and a third lens group of positive power;

arranged such that radiation entering said system passes through said first lens group, said second lens group, said beamsplitter, and is reflected by said concave mirror back through said beamsplitter and through said third lens group.

31. A catadioptric optical reduction system as in claim 30 wherein:

the emerging numerical aperture is slightly larger than the object space numerical aperture.

* * * * *